(12) United States Patent
Ho

(10) Patent No.: US 7,782,659 B2
(45) Date of Patent: Aug. 24, 2010

(54) MAGNETIC MEMORY AND MEMORY CELL THEREOF AND METHOD OF MANUFACTURING THE MEMORY CELL

(75) Inventor: Chia-Hua Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 120 days.

(21) Appl. No.: 11/798,160

(22) Filed: May 10, 2007

(65) Prior Publication Data

US 2008/0278995 A1 Nov. 13, 2008

(51) Int. Cl.
*H01L 21/00* (2006.01)
(52) U.S. Cl. ........................ 365/158; 257/296
(58) Field of Classification Search .......... 257/E21.665, 257/295, E43.001–E43.007, E27.005–E27.006, 257/E27.008, E29.164, E29.169, E29.272, 257/E29.323; 360/324.11, 324.12; 365/158, 365/173; 438/3, 785, E21.008, E21.436, 438/E21.663–E21.665, E27.104, 68–71, 438/296–309, 21.665
See application file for complete search history.

(56) References Cited

U.S. PATENT DOCUMENTS

| | | | | |
|---|---|---|---|---|
| 6,172,904 | B1 * | 1/2001 | Anthony et al. | ............. 365/173 |
| 6,940,383 | B2 * | 9/2005 | Albertini et al. | ............ 336/200 |
| 2002/0044396 | A1 * | 4/2002 | Amano et al. | ............ 360/324.2 |
| 2005/0041456 | A1 * | 2/2005 | Saito | .......................... 365/145 |
| 2006/0054947 | A1 * | 3/2006 | Asao et al. | .................. 257/295 |

* cited by examiner

*Primary Examiner*—Dao H Nguyen
*Assistant Examiner*—Tram H Nguyen
(74) *Attorney, Agent, or Firm*—Birch, Stewart, Kolasch & Birch, LLP

(57) ABSTRACT

A magnetic memory, a memory cell thereof, and a method of manufacturing the memory cell are provided. The memory cell of the magnetic memory includes a bottom contact layer, a bit line, a magnetic stack structure and a dielectric material. The bit line is disposed over the bottom contact layer. The magnetic stack structure is disposed between the bottom contact layer and the bit line. The dielectric material at least fills between the bottom contact layer and the bit line and surrounds the magnetic stack structure. A gap is formed between the dielectric material and the magnetic stack structure. During programming of the memory cell, the magnetic stack structure generates heat, and the gap delays heat loss.

29 Claims, 5 Drawing Sheets

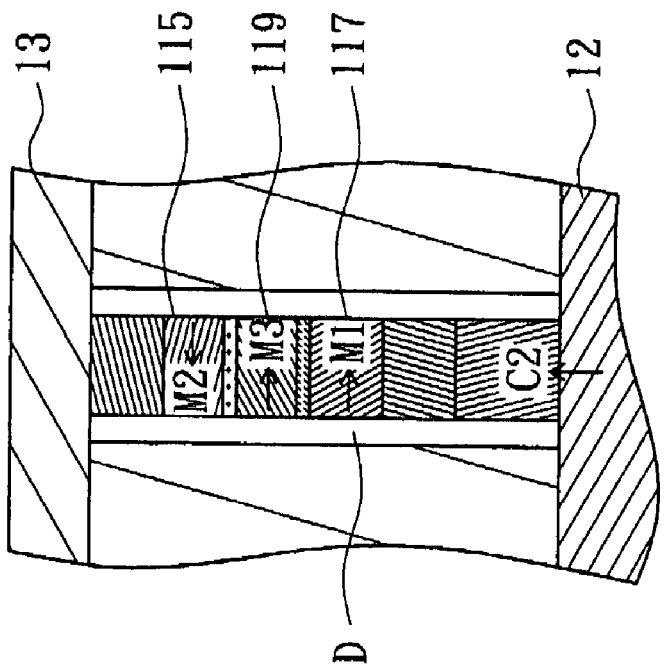
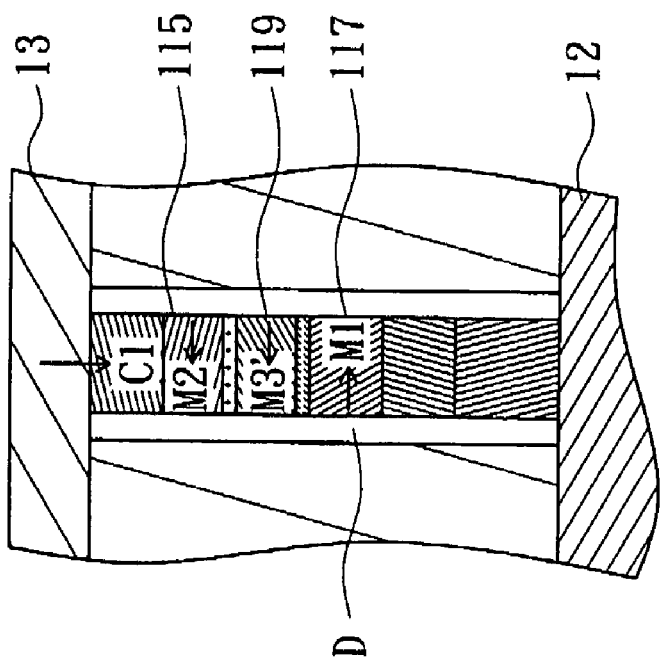
FIG. 3A
FIG. 3B

MAGNETIC MEMORY AND MEMORY CELL THEREOF AND METHOD OF MANUFACTURING THE MEMORY CELL

BACKGROUND OF THE INVENTION

1. Field of the Invention

The invention relates in general to a magnetic memory, a memory cell thereof and method of a manufacturing the memory cell, and more particularly to a thermally assisted spin-transferring magnetic memory, a memory cell thereof and a method of manufacturing the memory cell.

2. Description of the Related Art

Along with the popularity of consumer electronic products and the wide application of system products, the requirements expected of the memory, including power consumption, cost, read/write speed and erase times, are getting higher and higher. Therefore, new technologies for memories of separated markets are presented to break through the electron current restrictions of the memory, and hopefully become the mainstream technology for the new generation memory.

Among the new memory technologies, the magnetic memory composed of different ferromagnetic material layers, anti-ferromagnetic material layers and conductive material layers employs the unique characteristics of magnetic resistance in the non-destructive programming of data. The magnetic memory, having the features of high read/write speed as fast as the static random access memory (SRAM), non-volatility of the flash memory, high memory density close to the dynamic random access memory (DRAM) and nearly unlimited number of times in reading/re-writing data, has become a rising star in the field of non-volatile memory.

The magnetic memory, which has to be powered by electron current whose density is as high as $10^6 \sim 10^7 A/cm^2$ to perform spin-transfer for changing the magnitude of the magnetic resistance of the memory cell during programming, not only increases the power consumption of the memory, but also results in electron migration. Consequently, both the efficiency and the quality of the memory are affected. Therefore, how to effectively decrease the density of electron current during programming of the memory cell in a spin-transferring magnetic memory has become an imminent issue to be resolved.

SUMMARY OF THE INVENTION

The invention is directed to a magnetic memory, a memory cell thereof and a method of manufacturing the memory cell. A gap is formed between the side walls of the magnetic stack structure and the dielectric material that surrounds the side walls of the magnetic stack structure. When the memory cell is at a programming mode, the gap avoids the heat generated by the magnetic stack structure fast dissipating from the dielectric material, therefore maintains the temperature of the magnetic stack structure. The memory cell has the advantages of reducing the power consumption of the magnetic memory, increasing the stability of the magnetic memory and being compatible with conventional manufacturing process.

According to a first aspect of the present invention, a memory cell of a magnetic memory is provided. The memory cell includes a bottom contact layer, a bit line, a magnetic stack structure and a dielectric material. The bit line is disposed over the bottom contact layer. The magnetic stack structure is disposed between the bottom contact layer and the bit line. The dielectric material at least fills between the bottom contact layer and the bit line, and surrounds the magnetic stack structure. A gap is formed between the dielectric material and the magnetic stack structure.

According to a second aspect of the present invention, a method of manufacturing a memory cell of a magnetic memory is provided. First, a magnetic stack structure is formed on a bottom contact layer. Next, a liner layer is formed on the bottom contact layer and covers the side walls of the magnetic stack structure. Then, a first dielectric material is deposited on the bottom contact layer, the first dielectric material covers the liner layer and the top surface of the magnetic stack structure. Afterwards, the top surfaces of the first dielectric material, the liner layer and the magnetic stack structure are planarized. Further, the liner layer is removed, such that a gap is formed between the magnetic stack structure and the first dielectric material. After that, a bit line is formed on the first dielectric material, the gap and the magnetic stack structure.

According to a third aspect of the present invention, a magnetic memory is provided. The magnetic memory includes a bottom substrate, a gate stack, a memory cell, and a dielectric material. The bottom substrate has a drain region and a source region. The gate stack, disposed on the bottom substrate, is positioned between the drain region and the source region. The memory cell includes a bottom contact layer, a magnetic stack structure and a bit line. The bottom contact layer is electrically connected to the drain region. The magnetic stack structure is disposed on the bottom contact layer. The bit line is disposed on the magnetic stack structure. The dielectric material is disposed on the bottom substrate and covers the gate stack and the memory cell. There is a gap formed between the dielectric material and the side walls of the magnetic stack structure. While programming the memory cell, the magnetic stack structure generates heat, and the gap delays heat loss.

The invention will become apparent from the following detailed description of the preferred but non-limiting embodiments. The following description is made with reference to the accompanying drawings.

BRIEF DESCRIPTION OF THE DRAWINGS

FIG. 3A is a perspective showing the third magnetization direction when the electron current enters the memory cell from the bit line; and FIG. 3B is a perspective showing the third magnetization direction when the electron current enters the memory cell from the bottom contact layer.

DETAILED DESCRIPTION OF THE INVENTION

The invention is exemplified by an embodiment disclosed below. However, the technology of the invention is not limited thereto. The embodiment of the invention is for the purpose of elaboration not for limiting the scope of protection of the invention. In the embodiment, unnecessary elements are omitted to clearly show the technical characteristics of the invention.

Figure 1:
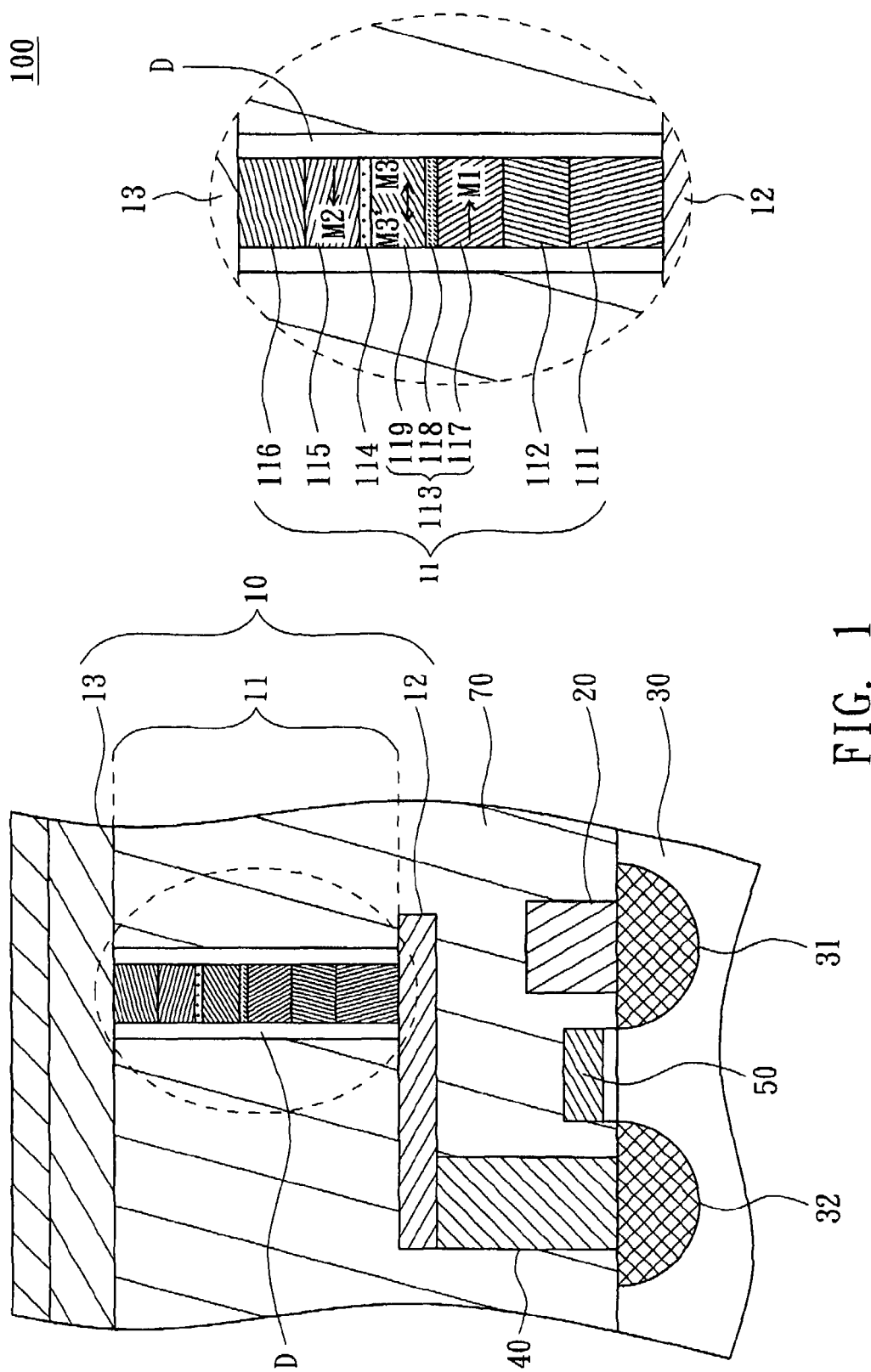
FIG. 1 is a magnetic memory according to a preferred embodiment of the invention.

Referring to FIG. 1, a magnetic memory according to the preferred embodiment of the invention is shown. The magnetic memory 100 includes a bottom substrate 30, a gate stack 50, a memory cell 10 and a dielectric material 70. The bottom substrate 30 includes a drain region 32 and a source region 31. The gate stack 50 is disposed on the bottom substrate 30 and positioned between the drain region 32 and the source region 31. The memory cell 10 includes a bottom contact layer 12, a magnetic stack structure 11 and a bit line 13. The bottom contact layer 12 is electrically connected to the drain region 32. The magnetic stack structure 11 is disposed on the bottom contact layer 12. The bit line 13 is disposed on the magnetic stack structure 11. The dielectric material 70 is disposed on the bottom substrate 30 and covers the gate stack 50 and the memory cell 10. A gap D is formed between the side walls of the dielectric material 70 and the magnetic stack structure 11. Preferably, the gap D contains air.

Furthermore, the magnetic stack structure 11 includes a first electrode layer 111, a pinning layer 112, a magnetic tunnel junction structure 113, a conductive layer 114, an upper pinned layer 115 and a second electrode layer 116. The first electrode layer 111 is disposed on the bottom contact layer 12. The pinning layer 112 is disposed on the first electrode layer 111. The magnetic tunnel junction structure 113 is disposed on the pinning layer 112 and includes a lower pinned layer 117, an insulator layer 118 and a free layer 119. The lower pinned layer 117 is disposed on the pinning layer 112 and has a first magnetization direction M1 that is inalterable. The pinning layer 112 is used for fixing the first magnetization direction M1 of the lower pinned layer 117. The insulator layer 118 disposed on the lower pinned layer 117 has a thickness approximately 0.7~3.0 nm, so that the electrons are able to tunnel through the insulator layer 118. The free layer 119 is disposed on the insulator layer 118 and has an alterable third magnetization direction M3 or M3'. The conductive layer 114 disposed on the magnetic tunnel junction structure 113 has a thickness approximately 3~6 nm for separating the upper pinned layer 115 from the free layer 119, such that the upper pinned layer 115 and the free layer 119 can maintain respective magnetization directions. The upper pinned layer 115 is disposed on the conductive layer 114 and has a second magnetization direction M2 that is fixed opposite to the first magnetization direction M1. The bottom contact layer 12 is electrically connected to the drain region 32 via a connecting plug 40 for example. The magnetic memory 100 further includes a local interconnection wire 20 electrically connected to the source region 31 for connecting a number of source regions 31 of the magnetic memories 100 in series. The local interconnection wire 20 orthogonaly crosses the bit line 13.

In the present embodiment of the invention, the lower pinned layer 117, the free layer 119 and the upper pinned layer 115 are preferably composed of at least one ferromagnetic material layer. The lower pinned layer 117 and the free layer 119 are respectively made from any alloy among the alloy group composed of iron cobalt (CoFe), iron nickel (NiFe), platinum cobalt (CoPt), iron cobalt boron (CoFeB), iron cobalt/iron nickel and iron nickel/iron cobalt boron for example. The upper pinned layer 115 is made from cobalt samarium (SmCo) for example. Any one who is skilled in the art related to the invention will understand that the technology of the invention is not limited thereto. For example, the upper pinned layer 115 and the lower pinned layer 117 can also respectively be a synthetic anti-ferromagnetic structure made from iron cobalt boron /ruthenium (Ru)/iron cobalt boron or iron cobalt/ruthenium/iron cobalt. Besides, the insulator layer 118 is made from aluminum trioxide ($Al_2O_3$) or magnesium oxide (MgO), and the pinning layer 112 is preferably made from an anti-ferromagnetic material, such as manganese iron (FeMn) or manganese platinum (PtMn). The conductive layer 114 can be made from ruthenium (Ru), iridium (Ir), silver (Ag) or platinum (Pt) for example. Further, the dielectric material 70 is silicon nitride for example.

Figure 2A:
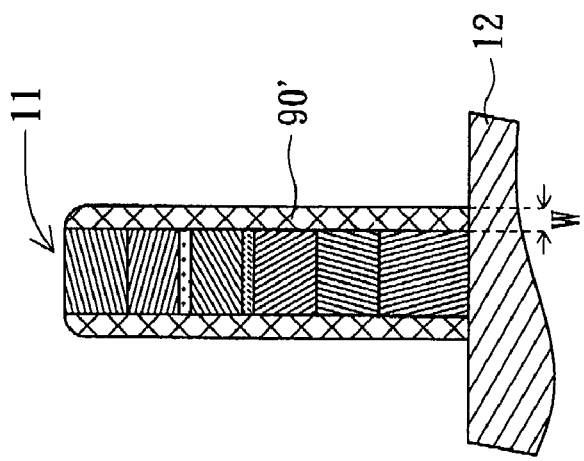
FIG. 2A is a perspective showing a magnetic stack structure according to the preferred embodiment of the invention formed on a bottom contact layer.
Figure 2B:
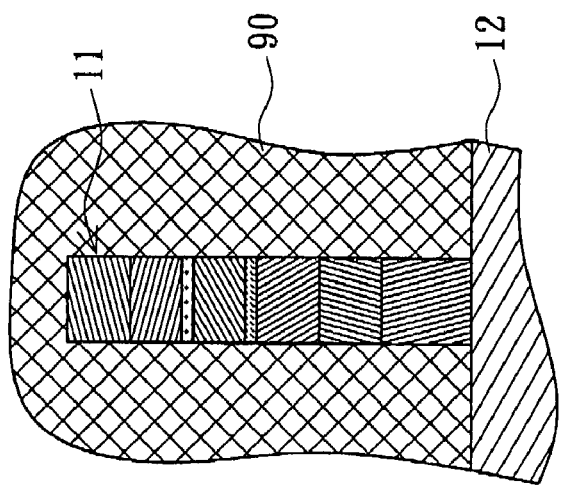
FIG. 2B is a perspective showing a second dielectric material deposited on the bottom contact layer in FIG. 2A.
Figure 2C:
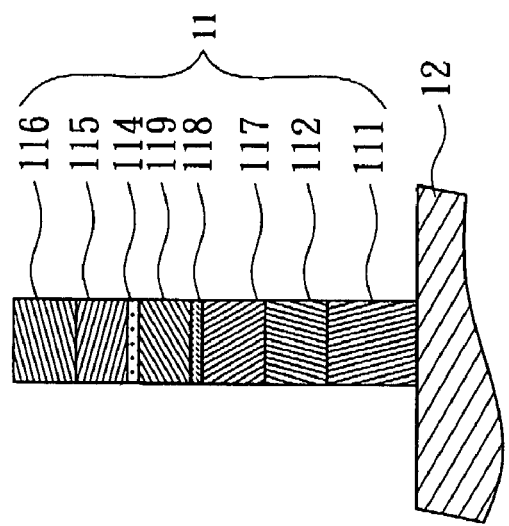
FIG. 2C is a perspective showing the second dielectric material in FIG. 2B after being etched.
Figure 2E:
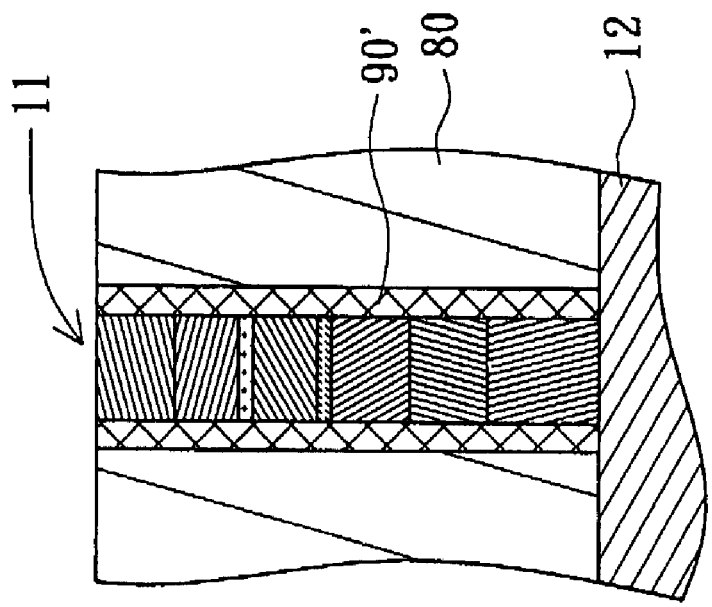
FIG. 2E is a perspective showing the top surfaces of the first dielectric material, the liner layer and the magnetic stack structure in FIG. 2D after being planarized.
Figure 2D:
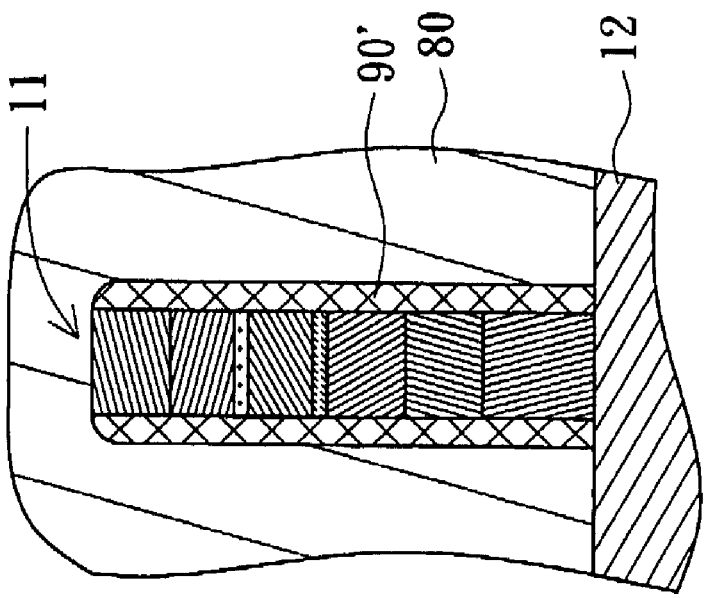
FIG. 2D is a perspective showing the first dielectric material deposited on the bottom contact layer in FIG. 2C.
Figure 2G:
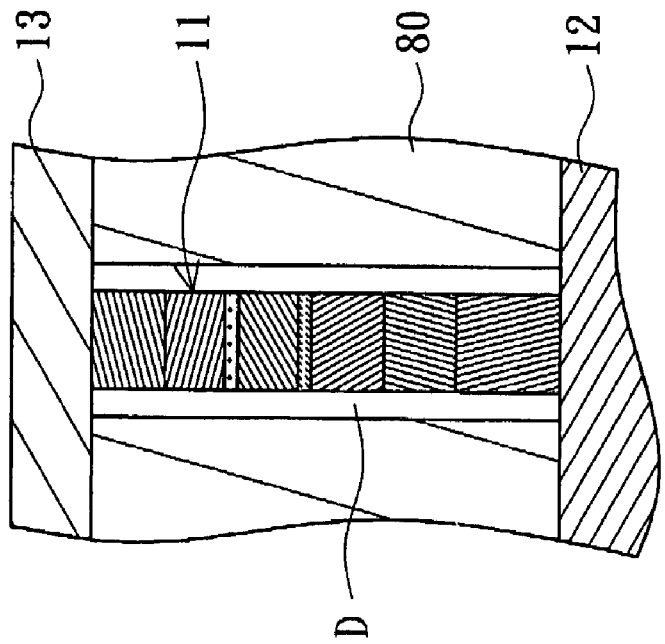
FIG. 2G is a perspective showing the bit line formed on the first dielectric material, the gap and the magnetic stack structure in FIG. 2F.
Figure 2F:
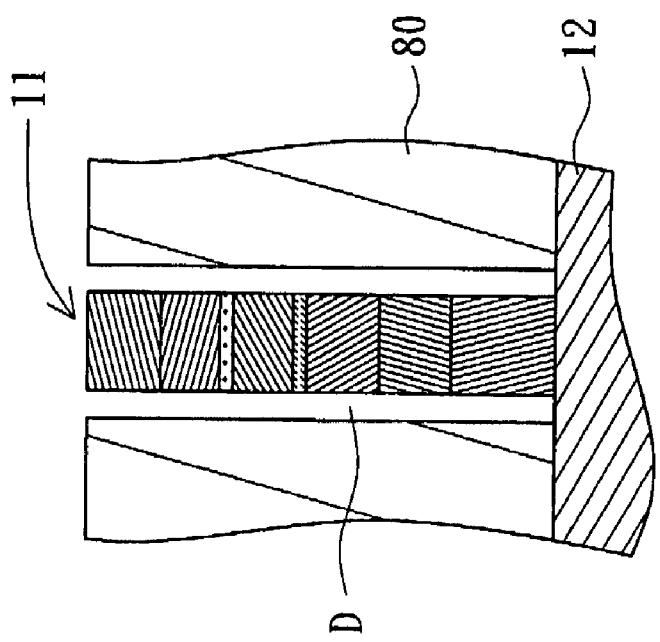
FIG. 2F is a perspective showing the liner layer in FIG. 2E after being removed.

On the other hand, the memory cell 10 of the present embodiment of the invention is manufactured according to a manufacturing method of a preferred embodiment of the invention. Please refer to FIG. 2A~2G. FIG. 2A is a perspective showing a magnetic stack structure according to the preferred embodiment of the invention formed on a bottom contact layer. FIG. 2B is a perspective showing a second dielectric material deposited on the bottom contact layer in FIG. 2A. FIG. 2C is a perspective showing the second dielectric material in FIG. 2B after being etched. FIG. 2D is a perspective showing the first dielectric material deposited on the bottom contact layer in FIG. 2C. FIG. 2E is a perspective showing the top surfaces of the first dielectric material, the liner layer and the magnetic stack structure in FIG. 2D after being planarized. FIG. 2F is a perspective showing the liner layer in FIG. 2E after being removed. FIG. 2G is a perspective showing the bit line formed on the first dielectric material, the gap and the magnetic stack structure in FIG. 2F.

The method of manufacturing the memory cell 10 according to the present embodiment of the invention includes following steps. First, as indicated in FIG. 2A, a magnetic stack structure 11 is formed on the bottom contact layer 12, and the width of the magnetic stack structure 11 is smaller than that of the bottom contact layer 12. The method of forming the magnetic stack structure 11 includes the following steps. First, a first electrode layer 111, a pinning layer 112, a lower pinned layer 117, an insulator layer 118, a free layer 119, a conductive layer 114, a upper pinned layer 115 and a second electrode layer 116 are formed sequentially by way of physical vapor deposition (PVD) for example. Next, the above-mentioned material layers 111~112 and 114~119 are patterned.

Next, a liner layer is formed on the bottom contact layer 12. The method of forming the liner layer includes the following steps. First, a second dielectric material 90 is deposited on the bottom contact layer 12. The second dielectric material 90 covers the magnetic stack structure 11, as indicated in FIG. 2B. Next, the second dielectric material 90 is etched to expose the top surface of the stack structure 11, such that the second dielectric material 90 covers the side walls of the magnetic stack structure 11 to a thickness W, as indicated in FIG. 2C. The etched second dielectric material 90 is the liner layer 90'.

Next, as indicated in FIG. 2D, a first dielectric material 80 is deposited on the bottom contact layer 12. The first dielectric material 80 covers the top surface of the magnetic stack structure 11 and the liner layer 90'.

Further, the top surfaces of the first dielectric material 80, the liner layer 90' and the magnetic stack structure 11 are planarized, as indicated in FIG. 2E. In the present embodiment of the invention, the planarized process is subjected to the chemical mechanical polishing (CMP) method.

Next, the liner layer 90' is removed, such that a gap D is formed between the magnetic stack structure 11 and the first dielectric material 80, as indicated in FIG. 2F. In the present embodiment of the invention, the liner layer 90' is removed by way of wet etching for example. The material of the first dielectric material 80 is preferably different from that of the liner layer 90', lest the first dielectric material 80 is removed as well while etching the liner layer 90'. After the liner layer 90' is removed, the gap D is filled with air.

After that, as indicated in FIG. 2G, a bit line 13 is formed on the first dielectric material 80, the gap D and the magnetic stack structure 11. The thickness of the gap D is the thickness W to which the second dielectric material 90 covers the side walls of the magnetic stack structure 11. The gap D is approximate 1~10 nm, lest the material of the bit line 13 might fill 10 into the gap D. After the step of forming the bit line 13, the memory cell 10 according to the preferred embodiment of the invention is completed. The first dielectric material 80 is the dielectric material 70 (illustrated in FIG. 1) of the magnetic memory 100 according to the preferred embodiment of the invention.

Referring to both FIG. 3A and 3B. FIG. 3A is a perspective showing the third magnetization direction when the electron current enters the memory cell from the bit line. FIG. 3B is a perspective showing the third magnetization direction when the electron current enters the memory cell from the bottom contact layer. The free layer 119 has a first coercivity, the upper pinned layer 115 has a second coercivity, and the lower pinned layer 117 has a third coercivity. The first coercivity is preferably smaller than the second coercivity and the third coercivity, such that the magnetization direction of the free layer 119 is easier to be reversed than the magnetization directions of the upper pinned layer 115 and the lower pinned layer 117. When the electron current enters the memory cell 10 from the bit line 13 along a first electron current direction C1, the free layer 119 has a third magnetization direction M3' the same as the second magnetization direction M2. When the electron S current enters the memory cell 10 from the bottom contact layer 12 along a second electron current direction C2, the free layer 119 has a third magnetization direction M3 the same as the first magnetization direction M1. The magnetic memory 100 determines whether the stored bit is 1 or 0 according to the difference in magnetic resistance between the third magnetization directions M3 and M3' and the first magnetization direction M1.

When the electron current flows through the magnetic stack structure 11, the magnetic stack structure 11 will generate heat. The gap D between the dielectric material 70 and the magnetic stack structure 11, approximate 1~10 nm, avoids the heat dissipating from the memory cell 10 through the transmission of the dielectric material 70 rapidly, such that the heat loss is delayed and the temperature of the memory cell 10 during programming is increased and maintained. The electron current density of the memory cell 10 during programming is expressed in the following equation:

$$j_c = J_{c0}[1-(kT/E)In(T_p/T_0)]$$

In the equation, $j_c$ denotes critical electron current density, T denotes temperature, $T_p$ denotes programming pulse time, $T_0$ denotes critical pulse time, and $J_{c0}$ is a constant. As indicated in the above equation, as the temperature T increases, the critical electron current density $J_c$ decreases accordingly, hence the power consumption of the magnetic memory 100 is effectively decreased. In the preferred embodiment, the gap D is filled with air for example. However, in another embodiment, the gap D can be vacuum either.

According to the magnetic memory, a memory cell thereof and a method of manufacturing the memory cell disclosed in a preferred embodiment of the invention, a gap is formed between the dielectric material and the magnetic stack structure, such that the temperature of the magnetic stack structure is raised as the electron current flows through the magnetic stack structure, the electron current density required by the memory cell during programming is decreased, and the power consumption of the magnetic memory is reduced accordingly. Moreover, as the power consumption is reduced, the stability of the magnetic memory is enhanced and product quality is improved. Therefore, by forming a gap between the dielectric material and the magnetic stack structure, the magnetic memory of the invention effectively reduces power consumption without employing complicated manufacturing procedures or incurring additional manufacturing cost. Besides, the magnetic memory of the invention does not require any additional element or material and is compactable with the conventional manufacturing process of semiconductor memory.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory cell of a magnetic memory, comprising:
   a bottom contact layer;
   a bit line disposed over the bottom contact layer;
   a magnetic stack structure disposed between the bottom contact layer and the bit line; and
   a dielectric material at least filling between the bottom contact layer and the bit line,
   wherein the dielectric material surrounds the magnetic stack structure, and an air or vacuum gap is formed between the dielectric material and the magnetic stack structure.

2. The memory cell according to claim 1, wherein the gap is approximately 1~10 nm.

3. The memory cell according to claim 1, wherein the magnetic stack structure comprises:
   a first electrode layer disposed on the bottom contact layer;
   a pinning layer disposed on the first electrode layer;
   a magnetic tunnel junction structure disposed on the pinning layer,
   wherein the bottom of the magnetic tunnel junction structure has a first magnetization direction that is inalterable;
   a conductive layer disposed on the magnetic tunnel junction structure; and
   an upper pinned layer disposed on the conductive layer, wherein the upper pinned layer has a second magnetization direction that is fixed opposite to the first magnetization direction.

4. The memory cell according to claim 3, wherein the magnetic tunnel junction structure comprises:
   a lower pinned layer disposed on the pinning layer, wherein the lower pinned layer has the first magnetization direction, and the pinning layer is used for fixing the first magnetization direction;
   an insulator layer disposed on the lower pinned layer; and
   a free layer disposed on the insulator layer with a third magnetization direction;

wherein, when an electron current enters the memory cell from the bottom contact layer, the third magnetization direction is the same as the first magnetization direction;

wherein, when the electron current enters the memory cell from the bit line, the third magnetization direction is the same as the second magnetization direction.

5. The memory cell according to claim 4, wherein the lower pinned layer, the free layer and the upper pinned layer are respectively formed by at least one ferromagnetic material layer.

6. The memory cell according to claim 5, wherein the lower pinned layer and the free layer are made from any of the alloy group of iron cobalt (CoFe), iron nickel (NiFe), platinum cobalt (CoPt), iron cobalt boron (CoFeB), iron cobalt/iron nickel or iron nickel/iron cobalt boron.

7. The memory cell according to claim 4, wherein the upper pinned layer is made from cobalt samarium alloy (SmCo).

8. The memory cell according to claim 4, wherein the lower pinned layer and the upper pinned layer are respectively a synthetic anti-ferromagnetic structure.

9. The memory cell according to claim 8, wherein the lower pinned layer and the upper pinned layer are respectively made from any of the alloy group of iron cobalt boron/ruthenium (Ru)/iron cobalt boron or iron cobalt/ruthenium/iron cobalt.

10. The memory cell according to claim 4, wherein the insulator layer is made from aluminum trioxide ($Al_2O_3$) or magnesium oxide (MgO).

11. The memory cell according to claim 4, wherein the thickness of the insulator layer is approximately 0.7~3.0 nm.

12. The memory cell according to claim 4, wherein the free layer has a first coercivity, the upper pinned layer has a second coercivity larger than the first coercivity.

13. The memory cell according to claim 3, wherein the pinning layer is made from an anti-ferromagnetic material.

14. The memory cell according to claim 13, wherein the pinning layer is made from manganese iron (FeMn) or manganese platinum (PtMn).

15. The memory cell according to claim 3, wherein the conductive layer is made from ruthenium (Ru), iridium (Ir), silver (Ag) or platinum (Pt).

16. The memory cell according to claim 3, wherein the thickness of the conductive layer is approximately 3~6 nm.

17. The memory cell according to claim 3, wherein the magnetic stack structure further comprises: a second electrode layer disposed between the upper pinned layer and the bit line.

18. The memory cell according to claim 1, wherein the dielectric material is silicon nitride.

19. A magnetic memory, comprising:
a bottom substrate having a drain region and a source region;
a gate stack disposed on the bottom substrate, wherein the gate stack is positioned between the drain region and the source region;
a memory cell, comprising:
a bottom contact layer electrically connected to the drain region;
a magnetic stack structure disposed on the bottom contact layer; and
a bit line disposed on the magnetic stack structure; and
a dielectric material disposed on the bottom substrate, wherein the dielectric material covers the gate stack and the memory cell, and an air or vacuum gap is formed between the dielectric material and the side walls of the magnetic stack structure.

20. The magnetic memory according to claim 19, wherein the gap is approximately 1~10 nm.

21. The magnetic memory according to claim 19, wherein the magnetic stack structure comprises:
a first electrode layer disposed on the bottom contact layer;
a pinning layer disposed on the first electrode layer;
a magnetic tunnel junction structure disposed on the pinning layer, wherein the bottom of the magnetic tunnel junction structure has a first magnetization direction that is inalterable;
a conductive layer disposed on the magnetic tunnel junction structure; and
an upper pinned layer disposed on the conductive layer, wherein the upper pinned layer has a second magnetization direction that is fixed opposite to the first magnetization direction.

22. The magnetic memory according to claim 21, wherein the magnetic tunnel junction structure comprises:
a lower pinned layer disposed on the pinning layer, wherein the lower pinned layer has the first magnetization direction, and the pinning layer is used for fixing the first magnetization direction;
an insulator layer disposed on the lower pinned layer; and
a free layer disposed on the insulator layer with a third magnetization direction;
wherein, when an electron current enters the memory cell from the bottom contact layer, the third magnetization direction is the same as the first magnetization direction;
wherein, when the electron current enters the memory cell from the bit line, the third magnetic direction is the same as the second magnetization direction.

23. The magnetic memory according to claim 22, wherein the thickness of the insulator layer is approximately 0.7~3.0 nm.

24. The magnetic memory according to claim 22, wherein the free layer has a first coercivity, and the upper pinned layer has a second coercivity larger than the first coercivity.

25. The magnetic memory according to claim 21, wherein the thickness of the conductive layer is approximately 3~6 nm.

26. The magnetic memory according to claim 19, wherein the bottom contact layer is electrically connected to the drain region via a connecting plug.

27. The magnetic memory according to claim 26, further comprises: a local interconnection wire electrically connected to the source region, the local interconnection wire orthogonaly crossing the bit line.

28. The magnetic memory according to claim 19, wherein the magnetic stack structure further comprises: a second electrode layer disposed between the upper pinned layer and the bit line.

29. The magnetic memory according to claim 19, wherein the dielectric material is silicon nitride.

* * * * *